United States Patent [19]

Marschall et al.

[11] 4,454,603
[45] Jun. 12, 1984

[54] SEMICONDUCTOR LASER

[75] Inventors: Peter Marschall, Neu-Ulm; Ewald Schlosser, Senden; Claus Wölk, Erbach, all of Fed. Rep. of Germany

[73] Assignee: LICENTIA Patent-Verwaltungs-GmbH, Frankfurt am Main, Fed. Rep. of Germany

[21] Appl. No.: 343,013

[22] Filed: Jan. 26, 1982

[30] Foreign Application Priority Data

Jan. 29, 1981 [DE] Fed. Rep. of Germany ....... 3102875

[51] Int. Cl.³ .............................................. H01S 3/18
[52] U.S. Cl. ...................................... 372/46; 357/17; 357/55; 357/67
[58] Field of Search ............... 372/44, 45, 46; 357/17, 357/55, 67

[56] References Cited

FOREIGN PATENT DOCUMENTS 52-65692 5/1977 Japan ..................................... 372/46

Primary Examiner—James W. Davie
Attorney, Agent, or Firm—Spencer & Frank

[57] ABSTRACT

An improved semiconductor laser of the type composed of a sequence of semiconductor layers forming a heterostructure diode including a substantially homogeneously doped layer defining a laser active zone having a laser radiation exit face perpendicular to the layers, two respectively differently doped semiconductor layers disposed at respectively opposite sides of the active zone, a monocrystalline outer layer located in the layer sequence and spaced from one of the differently doped semiconductor layers by an additional layer, a trough-shaped recess extending essentially perpendicularly to the radiation exit face formed in the outer major surface of the monocrystalline layer, and means disposed adjacent the recess for constricting the current flow in the forward direction of the diode to a narrow strip-shaped region in the laser active zone. The series resistance of such a laser is lowered in that the bottom of the recess is formed by the additional semiconductor layer adjacent the monocrystalline layer and an electrically conductive contact is provided on at least the bottom of the recess.

20 Claims, 2 Drawing Figures

SEMICONDUCTOR LASER

BACKGROUND OF THE INVENTION

The present invention relates to a semiconductor laser of the type having a layer sequence formed as a heterostructure diode in which a substantially homogeneously doped laser active zone is enclosed on each of two sides by two semiconductor layers having respectively different dopings and provided with means for constricting the current flowing in the forward direction of the diode to a narrow strip-shaped region of the laser active zone.

Such semiconductor lasers are used, for example, in the optical data transmission art, as light transmitters for optical fibers.

One such semiconductor laser, as shown in FIG. 1, is disclosed in Federal Republic of Germany Offenlegungsschrift (DE-OS) No. 2,822,146 corresponding to U.S. Pat. No. 4,278,949 issued July 14th, 1981 to Peter Marschall et al, the subject matter of which is incorporated by reference. The layers 2, 3, 4 and 6 have here been grown epitaxially onto the substrate 1, with a trough-shaped recess 10 being etched in the upper layer 6 to suitably shape the diffusion region 7. The layers 2, 3, 4 and 6 are formed of InP, InGaAsP, InP and InP, respectively, and the substrate 1 is formed of InP. Generally, the diffusion region 7 is p-conductive so that, with a p-conductive layer 4 and an n-conductive layer 6, the current path is limited along the interface between layer 4 and layer 6. The electrically conductive contacts 8, 9 can be connected to electrical devices, not shown.

If such a semiconductor laser is dimensioned so that the emitted laser light lies in the longwave spectral range (wavelengths greater than $1\mu$), there occur annoying interferences during the so-called continuous wave operation of the semiconductor laser.

SUMMARY OF THE INVENTION

It is therefore the object of the present invention to provide a semiconductor laser which assures the most stable possible continuous wave operation, particularly in a spectral range where the wavelengths are greater than $1\mu$.

The above object is accomplished by the present invention in that in a semiconductor laser composed of a sequence of semiconductor layers forming a heterostructure diode and including a substantially homogeneously doped layer defining a laser active zone having a laser radiation exit face perpendicular to the layers, two respectively differently doped semiconductor layers disposed at respectively opposite sides of the active zone, a monocrystalline outer layer located in the layer sequence and spaced from one of the differently doped semiconductor layers by an additional intermediate layer, a trough-shaped recess extending essentially perpendicularly to the radiation exit face, formed in the outer major surface of the monocrystalline layer, and means disposed adjacent the recess for constricting the current flowing in the forward direction of the diode to a narrow, strip-shaped region in the laser active zone; the recess extends through the monocrystalline layer so that the bottom of the recess is formed by the additional layer and an electrically conductive contact is disposed on at least the bottom of the recess.

A first advantage of the invention is that only little annoying heat loss occurs in the semiconductor laser. A second advantage is that the manufacturing process for the semiconductor laser according to the invention is significantly simplified.

The invention is based on the surprising realization that the above-mentioned annoying interferences are the result of too high an electrical series resistance in the semiconductor laser shown in FIG. 1 and disclosed in DE-OS No. 2,822,146 and U.S. Pat. No. 4,278,949, since there an electrical contact is formed on p-InP, i.e. the diffusion region 7.

The present invention makes possible an electrical series resistance which is less than 5 ohm.

DETAILED DESCRIPTION OF THE PREFERRED EMBODIMENTS

Figure 1:
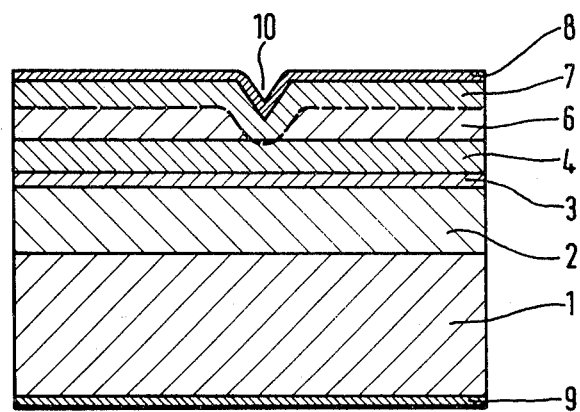
FIG. 1 is a cross sectional view of a semiconductor laser according to the above-identified U.S. patent.
Figure 2:
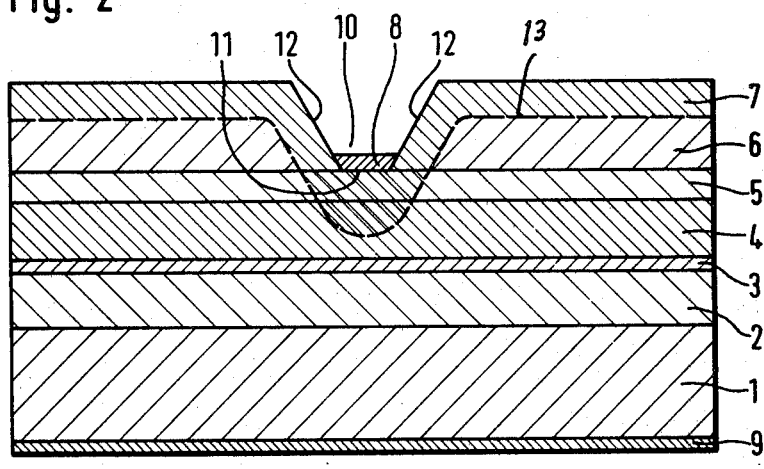
FIG. 2 is a cross sectional view of a preferred embodiment of a semiconductor laser according to the invention.

Turning now to FIG. 2, there is shown essentially the semiconductor laser of FIG. 1. In particular, FIG. 2 shows a double-hetero strip structure semiconductor laser for emitted light of a wavelength between 1.1 and $1.6\mu$ comprising the following semiconductor layers.

Layer 1: InP substrate, n-type, thickness$\cong 300\mu$.

Layer 2: InP layer, n-type, thickness$\cong 5\mu$.

Layer 3: $Ga_xIn_{1-x}As_yP_{1-y}$ layer, p-type, thickness$\cong 0.15$–$0.25\mu$, $0.15 < x < 0.47$, $x/y \approx 0.47$, constituting the active zone.

Layer 4: InP layer, p-type, thickness$\cong 2\mu$.

Layer 5: $Ga_{x'}In_{1-x'}As_{y'}P_{1-y'}$ layer, n-type, thickness$\cong 1\mu$. $0.15 < x' < 0.47$, $x' \leq x$; $x'/y' \approx 0.47$.

Layer 6: InP layer, n-type, thickness$\cong 2$–$3\mu$.

The layers 2–6 are grown epitaxially, preferably by liquid phase epitaxy, on the substrate 1, which has a crystal orientation (100).

The doping concentrations of the layers 1 and 2 are about $2.5 \times 10^{18}/cm^3$. For the layers 3, 4, 5 and 6, a concentration of about $2.5 \times 10^{17}/cm^3$ is preferred.

After formation of the layer sequence 1-6, a strip-shaped trough-like recess 10 is made in layer 6 using photoresist and etching techniques, so that the bottom 11 of the recess 10 is formed by layer 5. In particular, a photoresist mask (not shown) is applied to the outer major surface of layer 6 and the mask is provided with openings, in the conventional manner, in order to permit etching of a trough-shaped, and preferably trapezoidal-shaped, groove in layer 6. Preferably, during the exposure process to form the photoresist mask, the exposure mask is focused on the (100) crystal surface in such a manner that the strips defining the openings lie parallel to one $<110>$ direction, causing the sides 12 of the etched groove 10 to develop in the (111) A-crystal planes during the subsequent etching step. These crystal faces, or groove sides, 12 form an angle of about 55° with the (100) wafer surface. Preferably, as shown, the groove 10 is etched so that it extends just to the surface of the layer 5, i.e. the plane of the interface of layers 5 and 6. This is accomplished, for example, with the aid of a material selective etching solution which attacks InP (layer 6) but does not etch $Ga_xIn_{1-x}As_yP_{1-y}$, so that the layer 5 is exposed and serves as the bottom 11 of the recess 10.

For example, a mixture of equal volumes of concentrated hydrochloric acid and concentrated phosphoric acid is used for the etching solution.

Following etching and removal of the photoresist mask, the entire outer major surface of the layer 6 is subjected to a diffusion of a p-type impurity, preferably Zn as described in the above-identified U.S. Pat. No. 4,278,949. Due to the particular contoured structure of the surface resulting from the presence of the groove 10, the diffusion operation creates the diffusion front 13 as shown in FIG. 2. The diffusion depth is selected so that the protruding portion of this front, which underlies the groove 10, passes through layer 5 and partially penetrates the layer 4. Due to the relatively high concentration of p-type impurity atoms in the regions into which the impurity has been diffused, there then only exists p-type material i.e., the region 7, behind front 13. In this way a narrow, p-conductive channel is formed between the upper or outer surface of layer 6 and layer 4.

After forming the diffused region 7 and the resulting strip-shaped, p-conductive channel from the surface to layer 4 by entire-area p-diffusion, a metal contact 8 is applied such that a p-contact is formed at the bottom of the trough 10 on p+-GaInAsP i.e., the exposed portion of the layer 5 forming the bottom 11, and outside thereof on p-InP.

Very good contacts can be made on p-GaInAsP, particularly if the semiconductor layer 5 has been p+ doped by means of a Zn diffusion. The reason for this is the high attainable p doping ($>10^{19}$ cm$^{-3}$) and the low band gap of this material. Preferably, the contact 8 is a Ti-Pt-Au, a Zn-Au, or a Cr-Au contact layer sequence.

In the solution according to the invention, the contact resistance is low in that the contact 8 is formed at the bottom 11 of the recess 10 on p+-GaInAsP. A further way to arrive at low contact resistances is to grow, on a layer sequence according to U.S. Pat. No. 4,278,949, an additional n-GaInAsP layer in which the recess 10 is formed and in which, after the diffusion, the contact 8 is applied. In this case, however, a thickness of several microns would be required for the additional n-GaInAsP layer. However, it is very difficult, for example by way of liquid phase epitaxy, to grow GaInAsP layers of several microns in thickness and a good surface quality. In the solution according to the invention, however, a layer thickness of $\leq 1\mu$ is sufficient for the n-GaInAsP layer 5 and such a thickness can easily be grown.

As mentioned above, producing the recess 10 in the n-InP layer 6, by means of a material selective etching agent, which attacks InP but does not attach GaInAsP, brings about the result that the depth etching comes to a standstill when the GaInAsP layer 5 is reached. The depth of the trough-like recess 10 thus becomes independent of the etching conditions and is given by the thickness of the layer 6. The width of the recess 10, and thus the width of bottom 11, can be selected by means of a corresponding etching mask.

The present invention is not limited to the stated semiconductor material, but can also be used, for example, for GaAs—GaAlAs semiconductor lasers. In that case, in the device shown in FIG. 2 it is merely necessary to replace InP by GaAlAs or GaInAsP by GaAs. In such case, the substrate (semiconductor layer 1) should be GaAs.

In such case a laser structure according to the invention comprises the following semiconductor layers.

Layer 1: GaAs substrate, n-type, thickness$\simeq$300$\mu$

Layer 2: Ga$_{1-x}$Al$_x$As, n-type, thickness$\simeq$5$\mu$, $0.3 \leq x \leq 0.4$ Layer 3: Ga$_{1-x'}$Al$_{x'}$As, n or p-type, thickness$\simeq$0.1-0.2$\mu$, $0 \leq x' \leq 0.1$ Layer 4: Ga$_{1-x''}$Al$_{x''}$As, p-type, thickness$\simeq$2$\mu$, $0.3 \leq x'' \leq 0.4$ Layer 5: GaAs, n-type, thickness$\simeq$1$\mu$ Layer 6: Ga$_{1-x'''}$Al$_{x'''}$As, n-type thickness 2-3$\mu$, $0.3 \leq x''' \leq 0.5$ The doping concentration in layer 1 is about $2 \times 10^{18}$/cm$^3$ and preferably about $3 \times 10^{17}$/cm$^3$ in the remaining layers.

To make a semiconductor laser according to FIG. 2, which emits at a wavelength around 1.3$\mu$, in a first step the layers 1-6 are grown by conventional liquid-phase-epitaxy on a (100) oriented, tin or sulfur doped InP substrate. Growth is performed at a temperature between 650° and 630° C. The composition of the quaternary layers 3 and 5 is chosen to give Ga$_{0.28}$In$_{0.72}$As$_{0.60}$P$_{0.40}$. In this case, the layers have the lattice constant of the InP substrate. N or p-type doping is achieved by adding tin or zinc to the growth melts. The growth time is typically 1 to 5 seconds for layer 3 and 1 to 10 minutes for the other layers. For the etching process to form the recess 10, a photoresist mask with stripes parallel to the (110) direction is formed on layer 6 by a standard photolithographic process. The stripe-width is typically 8$\mu$. For etching, the wafer is immersed for ten seconds into a solution of equal parts of concentrated hydrochloric acid and phosphoric acid (85% wt). After removing the photoresistmask, a zinc diffusion process is carried out to form layer 7. The diffusion is performed at 560° C. in an evacuated quartz ampoule containing zincphosphide as a source material. The diffusion time, typically twelve minutes is adjusted so that the diffusion front below the recess penetrates at least 0.5$\mu$ into layer 4. After thinning the substrate 1 to approximately 100$\mu$, the contact 8 is formed by evaporating a 0.3$\mu$ thick layer of Zn-Au (3% wt zinc) on the whole area of the wafer, which is heated up to 390° C. during evaporation. In FIG. 2 only the most important part of the contact at the bottom of the recess is shown. The contact 9 is deposed by evaporating layers of 0.05$\mu$ thick Ni and 0.3$\mu$ thick Au/Ge (12% wt. Ge) and alloying at 395° C. for fifteen seconds. After cleaving the wafer to individual chips of 280$\mu$ length and approximately 250$\mu$ width, the laser is soldered p-side down to a copper heat-sink using In as a solder. Finally for completing the device, a gold wire is bonded to the contact 9.

In summary, a reduction of the series resistance is possible, according to the invention, in that the trough-like recess 10 is shaped in such a way that its bottom 11 is defined by the semiconductor layer 5 and that at least one electrical contact 8 is connected with the semiconductor layer 5 in the most low-resistance manner possible. It is advisable to design the contact 8 as in FIG. 1, i.e., so that the monocrystalline semiconductor layer 6 of FIG. 2 is covered over its entire area. This makes possible increased dissipation of possibly developing heat and simplifies the manufacture of the semiconductor laser.

It will be understood that the above description of the present invention is susceptible to various modifications, changes and adaptations, and the same are intended to be comprehended within the meaning and range of equivalents of the appended claims.

What is claimed is:

1. In a semiconductor laser composed of a sequence of semiconductor layers forming a heterostructure diode including a substantially homogeneously doped layer defining a laser active zone having a laser radiation exit face perpendicular to the layers, two respectively differently doped semiconductor layers disposed at respectively opposite sides of said active zone, a monocrystalline outer layer which, in the layer sequence, is spaced from one of said differently doped semiconductor layers by an additional intermediate layer, a trough-shaped recess formed in the outer major surface of said monocrystalline outer layer and extending essentially perpendicularly to said radiation exit face, and means disposed adjacent said recess for constricting the current flowing in the forward direction of the diode to a narrow, strip-shaped region in said laser active zone; the improvement wherein: said recess extends through said monocrystalline outer layer so that the bottom of the recess is formed by said additional intermediate semiconductor layer; an electrically conductive contact is disposed on at least said bottom of said recess; said additional intermediate layer is formed of GaAs which at least at the location of said contact is of p+ type conductivity; and said contact is selected from the group consisting of a Ti-Pt-Au contact, a Zn-Au contact and a Cr-Au contact.

2. A semiconductor laser as defined in claim 1 wherein said means for constricting comprises:
a doped region extending from said outer surface provided with said recess toward but not into said active zone and formed by diffusion from said outer surface of a doping material which gives said doped region the same conductivity type as said one of said differently doped layers, said doped region being delimited by a diffusion front substantially parallel, and corressponding in contour, to said surface provided with said recess, and said diffusion front being located for providing a localized semiconductor region of a single conductivity type in the area below said recess and between said recess and said active zone, and semiconductive regions of the respectively opposite conductivity type separated by said diffusion front in areas adjacent the localized region.

3. A semiconductor laser as defined in claim 1 wherein said contact is a metal contact.

4. In a semiconductor laser composed of a sequence of semiconductor layers forming a heterostructure diode including a substantially homogeneously doped layer defining a laser active zone having a laser radiation exit face perpendicular to the layers, two respectively differently doped semiconductor layers disposed at respectively opposite sides of said active zone, a monocrystalline outer layer which, in the layer sequence, is spaced from one of said differently doped semiconductor layers by an additional intermediate layer, a trough-shaped recess formed in the outer major surface of said monocrystalline outer layer and extending essentially perpendicularly to said radiation exit face, and means disposed adjacent said recess for constricting the current flowing in the forward direction of the diode to a narrow, strip-shaped region in said laser active zone; the improvement wherein said recess extends through said monocrystalline outer layer so that the bottom of the recess is formed by said additional intermediate semiconductor layer; and wherein an electrically conductive contact is disposed on at least said bottom of said recess; and said additional intermediate semiconductor layer is formed of GaInAsP which at least at the location of said contact is essentially of p+ type conductivity and said contact is selected from the group consisting of a Ti-Pt-Au contact, a Zn-Au contact, and a Cr-Au contact.

5. A semiconductor laser as defined in claim 4 wherein the p+ type conductivity of the GaInAsP layer is produced by the presence of Zn Atoms resulting from a Zn diffusion.

6. A semiconductor laser as defined in claim 1 wherein said trough-shaped recess has an essentially trapezoidal cross-section when seen perpendicularly to the direction of said recess, and said bottom of said recess is essentially formed by the surface of said additional semiconductor layer in the plane of its interface with said monocrystalline outer layer.

7. A semiconductor laser as defined in claim 6 wherein said recess is formed by selective etching.

8. A semiconductor laser as defined in claim 1 wherein the electrical series resistance of said semiconductor laser is less than 5 ohm.

9. A semiconductor laser as defined in claim 1 wherein at least one side face of said trough-shaped recess is formed essentially as a crystal plane of said monocrystalline outer layer.

10. A semiconductor laser as defined in claim 4 wherein: said monocrystalline semiconductor outer layer is formed essentially of InP; and said recess has at least one side face which is essentially a (111) A-crystal plane of said outer layer.

11. A semiconductor laser as defined in claim 9 wherein: said monocrystalline semiconductor outer layer is formed essentially of GaAlAs; and said recess has at least one side face which is essentially a (111) A-crystal plane.

12. A semiconductor laser as defined in claim 1 wherein said p+ type conductivity of said GaAs layer is produced by the presence of Zn atoms resulting from an In diffusion.

13. A semiconductor laser as defined in claim 4 wherein said means for constricting comprises:
a doped region extending from said outer surface provided with said recess toward but not into said active zone and formed by diffusion from said outer surface of a doping material which gives said doped region the same conductivity type as said one of said differently doped layers, said doped region being delimited by a diffusion front substantially parallel, and corresponding in contour, to said surface provided with said recess, and said diffusion front being located for providing a localized semiconductor region of a single conductivity type in the area below said recess and between said recess and said active zone, and semiconductive regions of the respectively opposite conductivity type separated by said diffusion front in areas adjacent the localized region.

14. A semiconductor laser composed of a sequence of semiconductor layers forming a heterostructure diode comprising: a substantially homogeneously doped layer defining a laser active zone having a laser radiation exit face perpendicular to the layers; two respectively opposite conductivity type semiconductor layers disposed on respectively opposite surfaces of said layer defining said active zone; a monocrystalline outer layer which, in the layer sequence, is spaced from one of said respectively opposite conductivity type layers by an additional intermediate layer which is of the same conductivity type as said outer layer and of the opposite conductivity type as said one of said two respectively opposite conductivity type layers; a trough-shaped recess formed in the outer major surface of said outer layer, said recess extending essentially perpendicularly to said radiation face and through said outer layer so that the bottom of said recess is formed by said additional intermediate layer; means disposed adjacent said recess for constricting the current flowing in the forward direction of the diode to a narrow strip shaped region in said laser active zone, said means including a highly conductive diffused surface region, of a conductivity type opposite that of said outer layer, extending along the side surfaces and said bottom of said recess, and through said additional intermediate layer into said one of said respectively opposite conductivity type layers; and an electrically conductive contact disposed on at least the portion of said diffused region extending along said bottom of said recess.

15. A semiconductor laser as defined in claim 14 wherein said additional intermediate semiconductor layer is formed of GaAs.

16. A semiconductor laser as defined in claim 15 wherein said highly conductive surface regions of p+ type conductivity, and said contact is selected from the group consisting of a Ti-Pt-Au contact, a Zn-Au contact and a Cr-Au contact.

17. A semiconductor laser as defined in claim 15 wherein: said outer layer, said two respectively opposite conductivity type layers and said layer defining a laser active zone are each formed of GaAlAs; and a semiconductor substrate layer of GaAs of the same conductivity type as the other of said two respectively opposite conductivity type layers is disposed on the outer surface of said other of said two respectively opposite conductivity type layers.

18. A semiconductor laser as defined in claim 14 wherein said additional intermediate semiconductor layer is formed of GaInAsP.

19. A semiconductor laser as defined in claim 18 wherein said highly conductive surface regions of p+ type conductivity, and said contact is selected from the group consisting of a Ti-Pt-Au contact, a Zn-Au contact and a Cr-Au contact.

20. A semiconductor laser as defined in claim 18 wherein: said layer forming said laser active zone is formed of GaInAsP; said outer layer and each of said two respectively opposite conductivity type layers are formed of InP; and a semiconductor substrate layer of InP of the same conductivity type as the other of said two respectively opposite conductivity type layers is disposed on the outer surface of said other of said two respectively opposite conductivity type layers.

* * * * *